(12) United States Patent
Wollesen

(10) Patent No.: US 6,215,155 B1
(45) Date of Patent: Apr. 10, 2001

(54) SILICON-ON-INSULATOR CONFIGURATION WHICH IS COMPATIBLE WITH BULK CMOS ARCHITECTURE

(75) Inventor: Donald L. Wollesen, Saratoga, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/420,605

(22) Filed: Oct. 18, 1999

Related U.S. Application Data

(63) Continuation of application No. 08/994,355, filed on Dec. 19, 1997, now abandoned.

(51) Int. Cl.[7] .................................................. H01L 27/01
(52) U.S. Cl. ...................... 257/351; 257/347; 257/349; 257/350; 257/354
(58) Field of Search ................................. 357/347, 350, 357/351, 348, 349, 352, 369, 354, 371

(56) References Cited

U.S. PATENT DOCUMENTS

| | | | |
|---|---|---|---|
| 5,359,219 | 10/1994 | Hwang | 257/351 |
| 5,463,238 | * 10/1995 | Takahashi et al. | 257/351 |
| 5,641,980 | 6/1997 | Yamaguchi et al. | 657/347 |

FOREIGN PATENT DOCUMENTS

| | | | |
|---|---|---|---|
| 0694977A3 | 1/1996 | (EP) | 29/786 |

OTHER PUBLICATIONS

Yoshino, A. et al: "High–speed Performance of 0.35 μm CMOS Gates Fabricated on Low–Dose SIMOC Substrates With/Without an N–Well Underneath the Buried Oxide Layer" IEEE Electron Device Letters, vol. 17, No. 3, Mar. 1, 1966 pp. 106–108.

Chen, W. et al: "Suppression of the SOI Floating–body Effects by Linked–body Device Structure" IEEE 1996 Symposium on VLSI Technology Digest of Technical Papers, 1996; pp. 92 and 93.

* cited by examiner

*Primary Examiner*—Minh Loan Tran
(74) *Attorney, Agent, or Firm*—Lariviere, Grubman & Payne, LLP

(57) ABSTRACT

A method for creating a SOI CMOS type device compatible with bulk CMOS using a bulk CMOS physical layout data base. The method uses the P-well and N-well masks used in fabrication of bulk CMOS devices. The N-well and P-well regions are fabricated by implanting the appropriate dopants above and below the buried oxide layer to create the basic SOI CMOS structure. Particular modifications to the basic SOI CMOS structure include providing a mask for establishing ohmic contact with the wells below the buried oxide layer. The modification uses a separate mask which is generated from the existing bulk CMOS mask database. The mask is generated by doing the following logical AND and OR functions on the existing CMOS layers:
a) SOURCE/DRAIN [AND] P$^+$ [AND] P-WELL [AND] 1st CONTACT
b) SOURCE/DRAIN [AND] N$^+$ [AND] N-WELL [AND] 1st CONTACT
c) a) [OR] b)

9 Claims, 5 Drawing Sheets

SILICON-ON-INSULATOR CONFIGURATION WHICH IS COMPATIBLE WITH BULK CMOS ARCHITECTURE

CROSS-REFERENCE TO RELATED APPLICATIONS

This is a continuation of U.S. patent application Ser. No. 08/994,355, filed Dec. 19, 1997, now abandoned.

TECHNICAL FIELD

The present invention relates to semiconductor device configurations and manufacturing processes. In particular, the invention relates to a silicon-on-insulator (SOI) configuration and manufacturing process which is compatible with existing bulk complementary metal oxide semiconductor (CMOS) device architectures.

BACKGROUND OF THE INVENTION

Complementary metal oxide semiconductor (CMOS) devices that are produced in mass quantities are referred to as "bulk" CMOS, because they include a semiconductive bulk substrate on which active or passive circuit elements are disposed. Recently, silicon-on-insulator (also referred to as silicon-oxide-insulator) SOI CMOS devices have been introduced which consume less power than do bulk CMOS devices. SOI devices are characterized by a thin layer of insulative material (the so-called buried oxide layer, or "SOI") that is sandwiched between a bulk substrate and the circuit elements of the device. Typically, no other layers of material are interposed between the SOI and the bulk substrate. In an SOI CMOS device, the circuit elements above the SOI are established by regions of a field oxide semiconductive layer which are doped as appropriate with N-type or P-type conductivity dopants. For example, for an N channel transistor, the field oxide layer will include a gate element disposed over a body region having a P-type dopant, with the body region being disposed between a source region and a drain region, each of which are doped with an N-type dopant. These devices provide an important advantage in many applications such as battery-powered mobile telephones and battery-powered laptop computers. Also, SOI CMOS devices advantageously operate at higher speeds than do bulk CMOS devices. SOI CMOS architecture eliminates inherent parasitic circuit elements in bulk CMOS due to junction capacitances between adjacent components. Also, CMOS circuits are very fast, due to the fact that the bulk capacitance is very small. SOI CMOS is also immune to latchup. Other problems surrounding the technology include the SOI floating-body effect. This particular problem has been addressed by others, by example, in a paper entitled "Suppression of the SOI Floating-body Effects by Linked-Body Device Structure," by W. Chen, et. al., 1996 Symposium on VLSI Technology Digest of Technical Papers.

One of the obstacles facing the increased use of SOI CMOS architecture is the fact that there is an enormous economic design investment in modern VLSI integrated circuit (IC) products. Typically, standard SOI does not behave the same way as bulk CMOS because of the dielectric isolation, and bulk CMOS designs are thus generally not compatible with, or readily transferable to an SOI architecture. Product groups must decide whether to re-design circuits for SOI CMOS, even when the circuit functions adequately using bulk CMOS, especially since the fabrication facilities will not try to run any new technology without a baseline. Although the prior art teaches combination of bulk CMOS and SOI CMOS architecture, by example Chen et.al. teaches locating wells above the buried oxide layer, the prior art does not teach any layout compatibility between the two architectures nor does it teach placing wells below the buried oxide layer. Thus, a need is seen to exist to provide a SOI configuration which is compatible with current bulk CMOS architecture. Using a bulk CMOS database, it would then be possible to create products rapidly for SOI fabrication and technologies.

Accordingly, it is a primary object of the present invention to provide a method for creating a SOI CMOS type device compatible with bulk CMOS.

A related object of the present invention is to provide method for creating a SOI CMOS device compatible with bulk CMOS using a bulk CMOS physical layout data base.

Still another object of the present invention is to provide an SOI CMOS device fabricated in accordance with the foregoing objects.

SUMMARY OF THE INVENTION

According to the invention there is provided a method for creating a SOI CMOS type device compatible with bulk CMOS, which device is created using a bulk CMOS physical layout data base. The method comprises using the P-well and N-well masks used in fabrication of the bulk CMOS devices. The N-well and P-well regions are fabricated by implanting the appropriate dopants above and below the buried oxide layer to create the basic SOI CMOS structure. Particular modifications to the basic SOI CMOS structure include providing a mask for establishing ohmic contact with the wells below the buried oxide layer. This can be accomplished by the use of a separate mask which is generated from the existing bulk CMOS mask database. The mask is generated by doing the following logical AND and OR functions on the existing CMOS layers:
a) SOURCE/DRAIN [AND] P+ [AND] P-WELL [AND] 1st CONTACT
b) SOURCE/DRAIN [AND] N+ [AND] N-WELL [AND] 1st CONTACT
c) a) [OR] b)

Other features of the invention are disclosed or apparent in the section entitled "BEST MODE OF CARRYING OUT THE INVENTION."

BRIEF DESCRIPTION OF THE DRAWINGS

For a fuller understanding of the present invention, reference is made to the accompanying drawings in the following detailed description of the Best Mode of Carrying Out the Invention. In the drawings.

Figure 1:
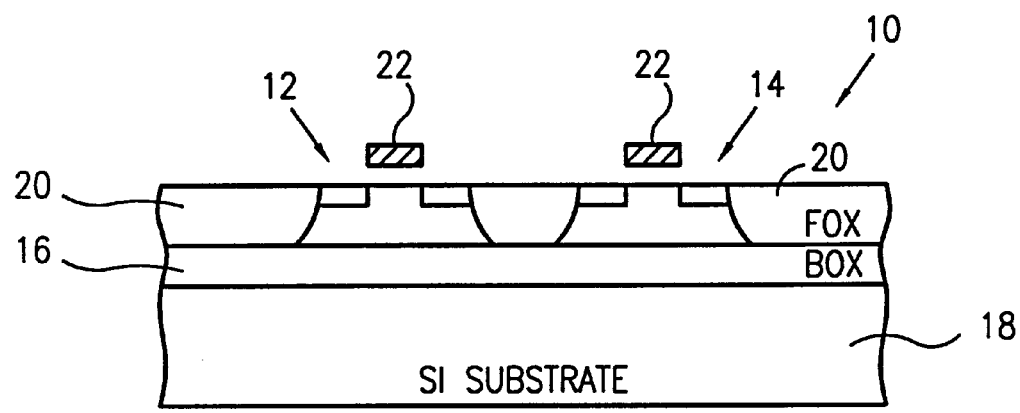
FIG. 1 is a cross-sectional view of a prior art SOI configuration.

Reference numbers refer to the same or equivalent parts of the present invention throughout the several figures of the drawing.

BEST MODE OF CARRYING OUT THE INVENTION

As semiconductor devices and manufacturing techniques are well known in the art, in order to avoid confusion, while enabling those skilled in the art to practice the claimed invention, this specification omits many details with respect to known items.

FIG. 1 shows a conventional SOI CMOS configuration. The SOI CMOS, generally indicated by the numeral 10, comprises an N-channel MOSFET 12 and a P-channel MOSFET 14 formed above a buried silicon oxide layer 16. The buried oxide layer (BOX) 16 is formed on a silicon substrate 18. Surrounding the MOSFETs 12 and 14 is a field oxide region (FOX) 20. Each MOSFET 12, 14 includes a polycrystalline silicon gate 22. Body region 24 is P-type doped for the N channel MOSFET 12, and body region 26 is N-type doped for the P-channel MOSFET 14. As will be appreciated from FIG. 1, the MOSFETs 12 and 14 are dielectrically isolated from all other MOSFETs by virtue of the BOX layer 16 and the FOX region 20, and are insulated from any conducting substrate by means of the BOX layer 16. As a result, latch-up problems are eliminated and leakage problems are minimized.

Figure 2:
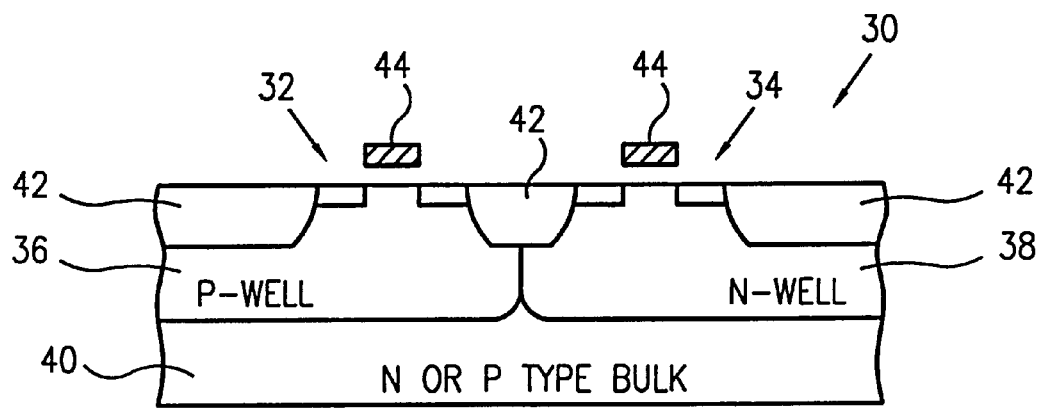
FIG. 2 is a cross-sectional view of a prior art bulk CMOS configuration.

FIG. 2 shows a conventional bulk CMOS configuration. The bulk CMOS, generally indicated by the numeral 30, comprises an N-channel MOSFET 32 and a P-channel MOSFET 34. The N-channel MOSFET 32 is located in a P-well 36, and the P-channel MOSFET 34 is located in an N-well 38. The P- and N-wells are formed in an N or P-type bulk 40, typically by means of ion implant and well drive. Surrounding the MOSFETs 32 and 34 is a field oxide region (FOX) 42. Each MOSFET 32, 34 includes a polycrystalline silicon gate 44.

When an electrical potential is applied to one of the gates 22 of the SOI CMOS 10, an electrical potential is drawn in the body regions 24 and 26 relative to the substrate 18. SOI MOSFET body regions have a floating electrical potential unless intentionally connected using area consuming layout methods. This effect is not found in bulk CMOS, and many bulk CMOS designs depend on the MOSFET body regions having a known electrical potential whereas SOI MOSFET's body regions are isolated from the bulk silicon. Also, circuit design simulations for SOI CMOS are based on the assumption that the MOSFETs are isolated from the bulk silicon, and circuit design performance depends on the silicon behaving in the same way as the model. Standard SOI does not behave the same way as bulk CMOS because of the dielectric isolation, and bulk CMOS designs are thus generally not compatible with, or readily transferable, to an SOI architecture.

Figure 3:
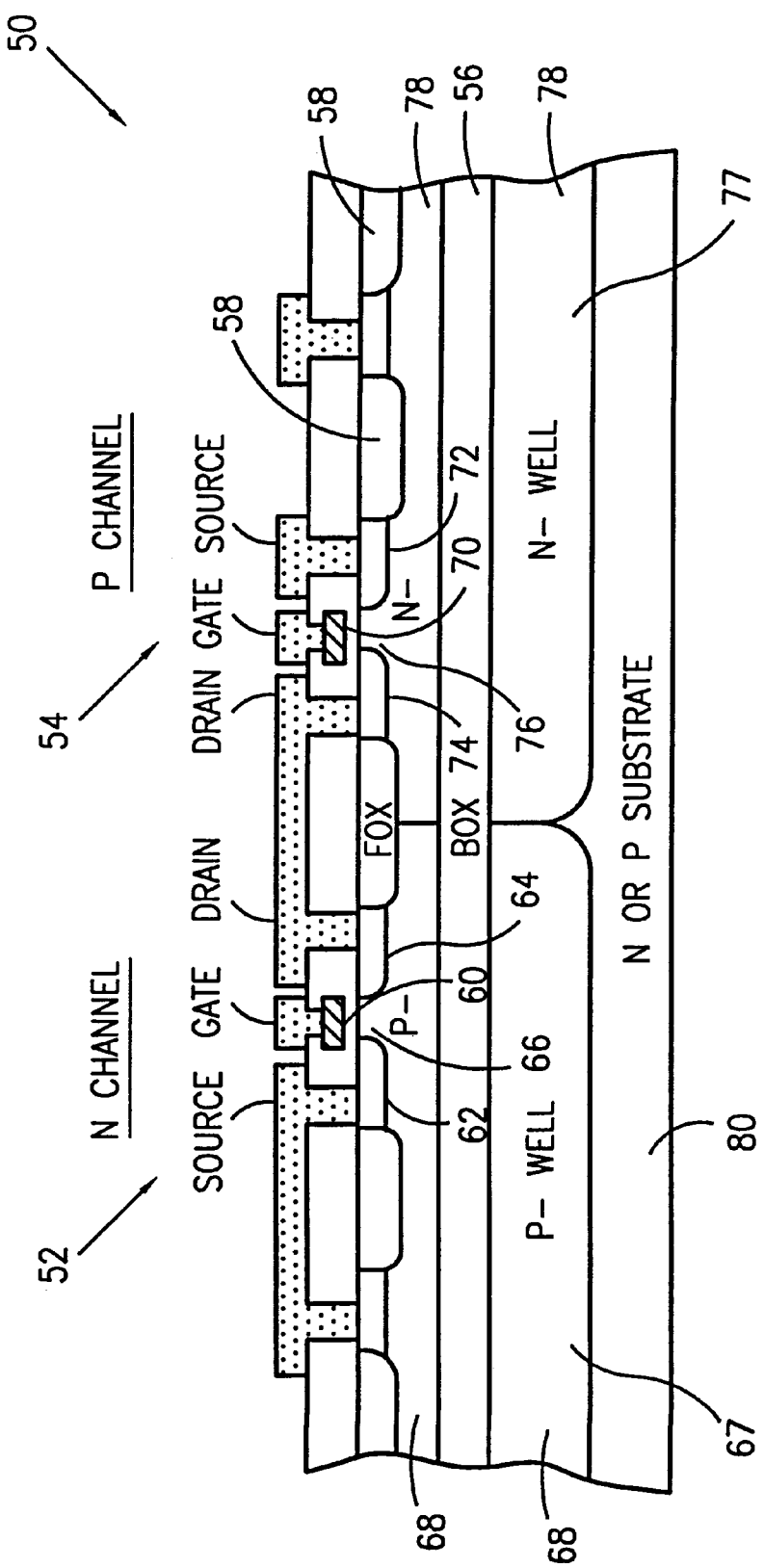
FIG. 3 is a cross-sectional view of a SOI CMOS device and architecture according to the invention.

A SOI-bulk CMOS compatible architecture according to the invention is shown in FIG. 3. The SOI-bulk well CMOS, generally indicated by the numeral 50, comprises an N-channel MOSFET 52 and a P-channel MOSFET 54 formed above a buried silicon oxide layer 56. The buried oxide layer (BOX) 56 is formed on a silicon substrate 80. Surrounding the MOSFETs 52 and 54 is a field oxide region 58 (FOX).

Figure 4:
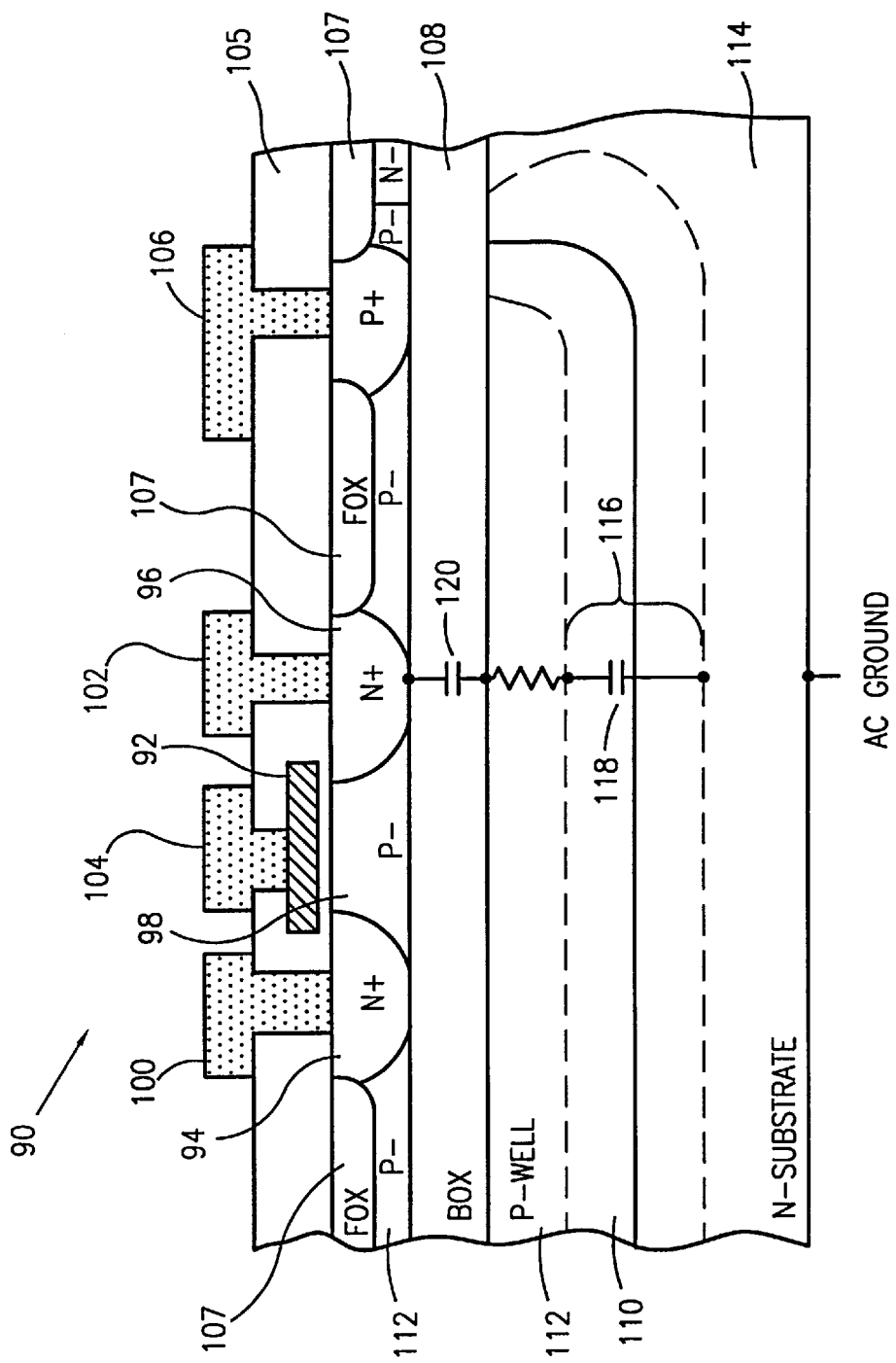
FIG. 4 is a cross-sectional view of a SOI CMOS device according to the invention, showing the well-to-substrate depletion spread and well-to-substrate capacitance.

The N-channel MOSFET 52 includes a polycrystalline silicon gate 60, a $N^+$ source region 62 and a $N^+$ drain region 64. Between the source region 62 and the drain region 64, and below the gate 60, a $P^-$ region 66 is provided. In FIG. 3, the source region 62 and the drain region 64 are shown to be shallower than the buried oxide layer, but in practice, the source region 62 and the drain region 64 may extend down to the buried oxide layer, as shown in FIG. 4. Located below the buried oxide layer 56 and below the $P^-$ region 66 is a region 67 which is of the same conductivity type i.e. P as the channel region 66. In the illustrated MOSFET 52, the region 67 is part of a P-well 68 which is formed above and below i.e. divided by the buried oxide layer 56. Similarly, the P-channel MOSFET 54 includes a polycrystalline silicon gate 70, a $P^+$ source region 72 and a $P^+$ drain region 74. Between the source region 72 and the drain region 74, and below the gate 70, an $N^-$ region 76 is provided. The source region 72 and the drain region 74 are shown to be shallower than the buried oxide layer 56, but in practice, the source region 72 and the drain region 74 may extend down to the buried oxide layer 56 as shown in FIG. 4. Located below the buried oxide layer 56 and below the $N^-$ region 76 is a region 77 which is of the same conductivity type i.e. N as the channel region 76. In the illustrated MOSFET 54, the region 77 is part of an N-well 78 which is formed above and below i.e. divided by the buried oxide layer 56. It should be obvious to one skilled in the art, that other planar MOSFET designs can be applied into this well formation method e.g. gates may be metal, polycide or salicide.

By using the standard bulk CMOS P-well and N-well masks, the wells 68 and 78 are implanted both above the buried oxide layer 56 and below the buried oxide layer 56 in the bulk region. In the embodiment illustrated in FIG. 3, the bulk region is an N, or P, substrate 80. One or more energy levels may be used for the ion implant of the wells 68, 78 after the buried oxide layer 56 is formed. In this regard, implant energies of 500 keV to several megavolts may be used. Alternatively, the wells 68, 78 may be formed using normal 100 keV or less implant energies followed by heavy oxygen implant for the formation of the buried oxide layer 56 using the SIMOX technique. The well drive then takes place during the oxygen implant anneal at approximately 1300° C. The architecture in FIG. 3 results in the reduction of parasitic junction capacitance under either N-channel or P-channel transistors. That is, if an N-substrate is used, the P-well will be junction isolated, that is, it will "float" electrically at approximately zero volts. A depletion zone will form between the P-well 68 and the substrate 80, which will serve to reduce charge transfer from all displacement current from electrode signals above it, eg. $N^+$ junctions 62, 64 and respective interconnects. The depletion zone and its effects are discussed in more detail below with reference to FIG. 4.

FIG. 4 shows the resistances, capacitances and the depletion zone formed under an N-channel MOSFET in the architecture according to the invention. As before, the N-channel MOSFET, generally indicated by the numeral 90 includes a polycrystalline silicon gate 92, a $N^+$ source region 94, and a $N^+$ drain region 96. Between the source region 94 and the drain region 96, and below the gate 92, a $P^-$ body region 98 is provided. Electrical contact to the source region 94, the gate region 96 and the gate 92, is made respectively by a metal source electrode 100, a metal drain electrode 102, and a metal gate electrode 104, which penetrate through an interoxide layer 105. Also provided is a metal P-well contact electrode 106. Surrounding the various semiconductor regions below the interoxide layer 105 is a field oxide layer 107. Also as before, a buried oxide layer 108 is present below the P⁻ body region 98. Located below the buried oxide layer 108 and below the P⁻ body region 98 is a region 112, which is of the same conductivity type i.e. P as the channel region 98. In the illustrated MOSFET 90, the region 110 is part of a P-well 112 which is formed above and below i.e. divided by the buried oxide layer 108. The P-well is formed in an N type substrate 114 using a bulk CMOS P-well mask as described with reference to FIG. 3. A depletion zone 116 forms between the P-well 112 and the N-substrate 114, which serves to reduce charge transfer due to displacement current induced in the substrate 114 by electrode signals applied to the N⁺ regions 94, 96, and interconnect 106. Since active devices are not placed in the P-well 112, below the buried oxide layer 108, the doping levels of the P-well 112 in this region, and of the substrate 114, may be very light, less than or approximately equal to 1.0E15 atoms/cc. This results in a depletion spread i.e. the size of the depletion zone 116 of approximately 1 μm, or greater, for very lightly doped P-well/N-substrate junctions. The capacitance 118 resulting from the depletion zone 116, together with the buried oxide layer capacitance 120, which are in series as shown, reduces the capacitance between the electrodes 100, 102, 106 and the N-substrate 114.

As discussed previously, existing bulk CMOS tooling is used in the SOI technique of the invention to form the N and P regions below the buried oxide layer shown in FIGS. 3 and 4. As a result, the N-channel and P-channel transistors 52, 54, and 90 are located in their respective correctly doped background material, and the substrate contacts, such as the P-substrate contact 106, will be positioned correctly to ohmically contact their underlying device wells. Thus, the SOI configuration of the invention is easily adaptable and manufacturable from existing bulk CMOS configurations, while retaining the advantages of prior art SOI configurations. It may also be desirable, in the SOI configuration of the invention, to ohmically contact the wells beneath the buried oxide layer. This can be accomplished, with some increase in process complexity, by the use of a separate mask which is generated from the existing bulk CMOS mask database. The mask is generated by doing the following logical AND and OR functions on the existing CMOS layers:

a) SOURCE/DRAIN [AND] P⁺ [AND] P-WELL [AND] 1st CONTACT
b) SOURCE/DRAIN [AND] N⁺ [AND] N-WELL [AND] 1st CONTACT
c) a) [OR] b)

Figure 6:
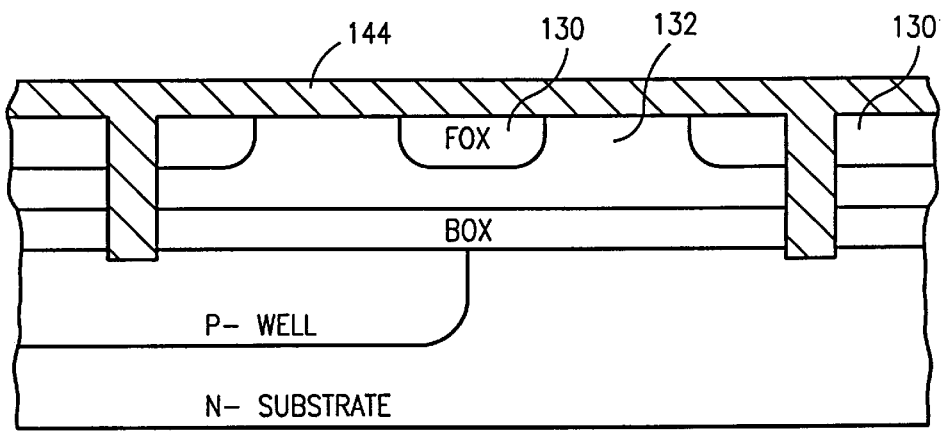
FIG. 6 shows a subsequent step in the method of forming well contact plugs in a SOI CMOS device according to the invention.
Figure 7:
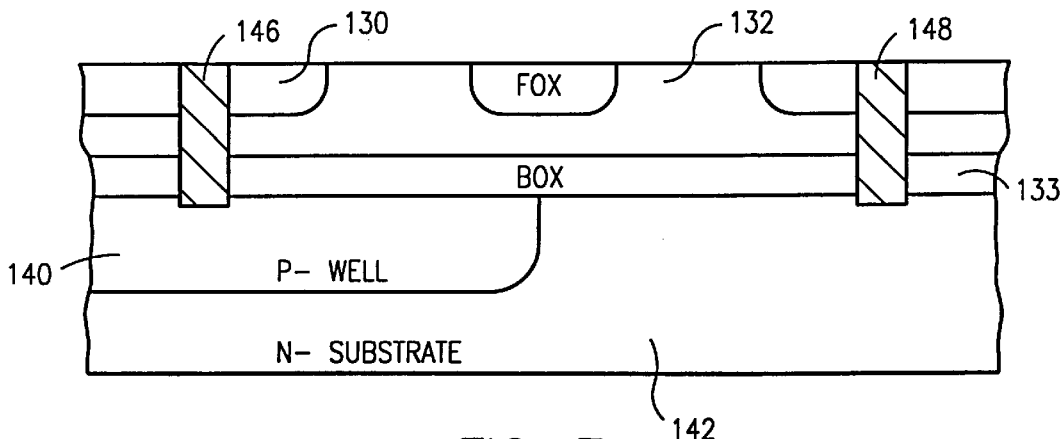
FIG. 7 is a cross-sectional view of a SOI CMOS device according to the invention, including well contact plugs.

The mask resulting from function c) is used to form a contact hole through the top silicon layer and through the buried oxide layer which may be filled with an appropriate substance for contacting the underlying wells. The formation and filling of the contact hole may be done at any step between the first step in the device fabrication process up to immediately before the N⁺ or P⁺ source or drain formation. In this regard, FIGS. 5 to 7 illustrate the formation of well contact plugs after field oxide formation.

Figure 5:
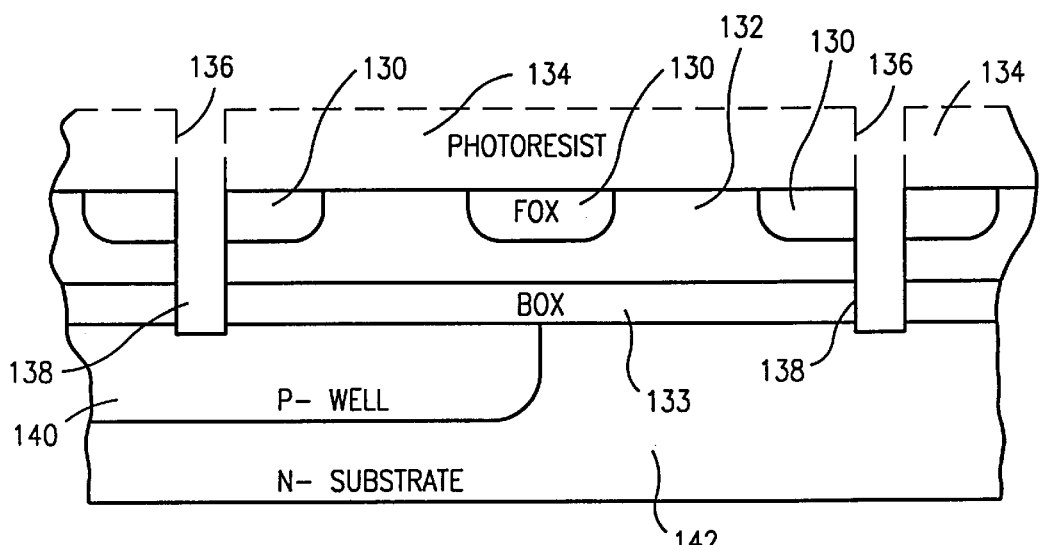
FIG. 5 shows a step in a method of forming well contact plugs in a SOI CMOS device according to the invention.

As shown in FIG. 5, after the formation of field oxide areas 130 in the silicon layer 132 above the buried oxide layer 133, a layer of photoresist 134 is deposited on the silicon layer 132. The photoresist layer 134 is exposed using the mask generated by the logical function c) above, and developed to define holes 136 in the photoresist layer 134. Then, a silicon dioxide etch is used to form the upper portions of contact holes 138 in field oxide areas 130; then a silicon etch is used to form the intermediate portions of contact holes 138. The silicon etch will normally stop on the buried oxide layer 133, and it is then necessary to switch to a plasma etch gas to etch through the buried oxide layer 133. The plasma etch will stop on the bulk silicon (the P-well 140 or the N-substrate 142), thereby completing the formation of the contact holes 138. Since a low resistance ohmic contact is not necessary for the contact plugs, the contact plugs are formed of polycrystalline silicon (polysilicon) which is deposited onto the silicon layer 132 and into the contact plug holes 138 by means of chemical vapor deposition (CVD). The deposited polysilicon is indicated in FIG. 6 by the numeral 144. The polysilicon 144 above the silicon 132 and above the field oxide 130 is removed using chemical mechanical polishing (CMP), to leave the structure shown in FIG. 7, with a polysilicon contact plug 146 penetrating the field oxide 130, the silicon layer 132 and the buried oxide layer 133 to contact the P-well 140, and a polysilicon contact plug 148 penetrating the field oxide 130, the silicon layer 132 and the buried oxide layer 133 to contact the N-substrate 142. As an alternative to polysilicon, the contact plugs 146 and 148 could be made of a refractory metal, but CVD polysilicon is preferred to eliminate contact barriers. In FIGS. 5 to 7, the P-well 140 is shown to be already formed. However, it is preferable to form the P-well (or N-well as the case may be) using MeV level implant energies after the formation of the contact plugs. This will result in the contact plugs having some implant doping embedded therein. This will facilitate ohmic contact through the plugs to the underlying wells. As can be seen from FIG. 7, the contact plugs 146 and 148 contact the silicon layer 132 above the buried oxide layer 133, thereby also correctly contacting the respective body regions for the N- and P-channel transistors yet to be formed in FIG. 7. Thus, not only is the well 140 connected to $V_{ss}$, but also the P-type body regions for all N-channel transistors. Likewise, not only is the N-substrate 142 connected to $V_{DD}$, but also the N-type body regions for all P-channel transistors.

During the subsequent N⁺ and P⁺ source and drain region implant, the contact plugs will receive additional doping which will improve their conductivity and further facilitate ohmic contact with the underlying wells or substrate.

It is important to note, however, that the wells below the buried oxide layer are only required to absorb reverse bias junction current leakage, and therefore, the ohmic resistance of the contact plugs may be as high as the mega-ohm range and still be acceptable. However, after undergoing the well doping and the source/drain doping as discussed above, the resistance of the plugs should be between approximately 100 ohms and 10,000 ohms. As well, leakage current is normally 1 μA or far less, this resistance range is acceptable.

Figure 8:
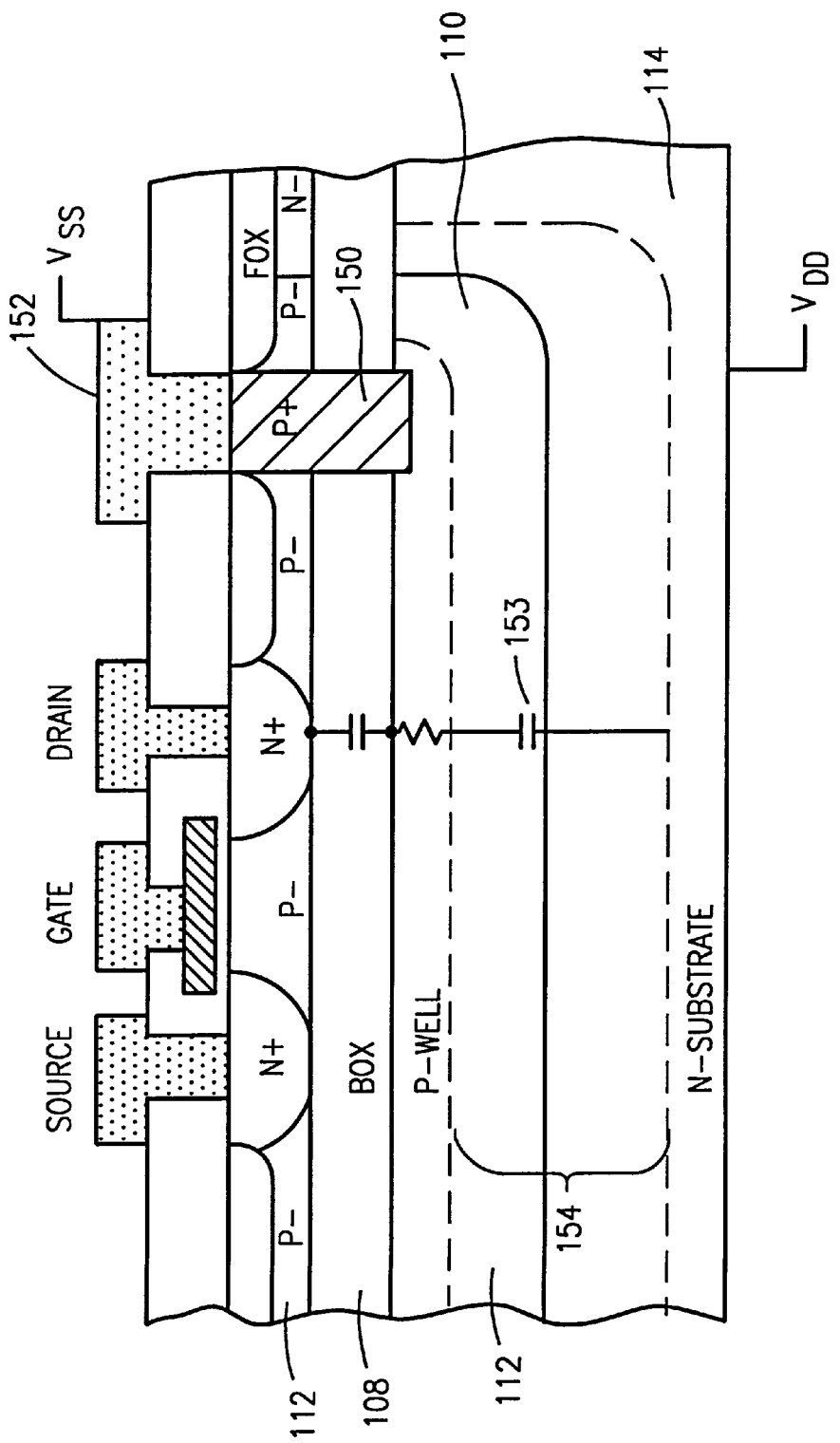
FIG. 8 is a cross-sectional view of a SOI CMOS device according to the invention, including well contact plugs, showing the well-to-substrate depletion spread and well-to-substrate capacitance.

FIG. 8 shows an N-channel MOSFET according to the invention, including well contact plugs, showing the well to substrate depletion spread and well to substrate capacitance.

For purposes of conciseness, common reference numerals will be used for elements which are common to FIGS. 4 and 8, and the discussion of these common elements above with reference to FIG. 4 applies equally to FIG. 8.

As can be seen from FIG. 8, the MOSFET includes a polycrystalline well contact plug 150 which extends through the buried oxide layer 108 to contact the P-well 112 which underlies the buried oxide layer 108. The P-well 112 is lightly doped (less than or approximately equal to 1.0E15 atoms/cc), and is biased to the source voltage ($V_{SS}$) via the contact electrode 152. The substrate 114 is biased to the drain voltage ($V_{DD}$). The light doping and the voltage bias ($V_{SS}$ to $V_{DD}$) results in a very small well-to-substrate capacitance 153, and a large (3 μm to 10 μm) depletion spread 154.

SOI designs claims faster gate speed than bulk CMOS. The configuration of the invention improves SOI speed further by reducing parasitic capacitance loads between the active devices and the substrate material. Further, the configuration of the invention provides the means whereby existing bulk CMOS database tooling can be used to provide a SOI configuration, with the attendant advantages inherent in SOI of reduced parasitic capacitance, improved speed, and the elimination of alpha particle SRAM memory faults. Further, by reducing the parasitic capacitance using wells implanted below the buried oxide layer, thinner buried oxide layers can be used compared to conventional SOI, reducing the large SIMOX manufacturing costs. Device yield is improved because pin-holes formed in the buried oxide layer do not affect device performance as in conventional SOI, because of the underlying wells in the configuration of the invention.

It will be appreciated that the invention is not limited to the embodiment of the invention described above, and many modifications are possible without departing from the spirit and the scope of the invention.

What is claimed is:

1. A SOI CMOS device comprising:

a P-channel CMOS transistor;

an N-channel CMOS transistor;

a first field oxide region adjacent to the P-channel CMOS transistor;

a second field oxide region adjacent to the N-channel CMOS transistor;

an electrically insulating layer located below the P-channel transistor, the first field oxide region, the second field oxide region and the N-channel CMOS transistor;

an N-type semiconductor region located above the electrically insulating layer and extending below the first field oxide region;

a P-type semiconductor region located above the electrically insulating layer and extending below the second field oxide region;

a P-type semiconductor region of a bulk semiconductor substrate located directly below the electrically insulating layer, below the N-channel CMOS transistor, the second field oxide region, and substantially in alignment with the P-type semiconductor region located above the electrically insulating layer; and an N-type semiconductor region of the bulk semiconductor substrate located directly below the electrically insulating layer, below the P-channel CMOS transistor, the first field oxide region, and substantially in alignment with the N-type semiconductor region located above the electrically insulating layer.

2. The SOI CMOS device, as recited in claim 1, wherein the N-type semiconductor region located above the electrically insulating layer completely separates the first field oxide region from the electrically insulating layer, wherein the N-type semiconductor region is an N-well and the P-type semiconductor region is a P-well, and wherein the N-well and the P-well are formed in the bulk semiconductor substrate selected from a group of substrates consisting essentially of an undoped substrate, a P-type substrate, and an N-type substrate.

3. The SOI CMOS device, as recited in claim 2, further comprising a contact plug extending through the first field oxide region, the N-type semiconductor region located above the electrically insulating layer, and the electrically insulating layer to the N-type semiconductor region located directly below the electrically insulating layer.

4. The SOI CMOS device, as recited in claim 1, further comprising a contact plug extending through the first field oxide region, the N-type semiconductor region located above the electrically insulating layer, and the electrically insulating layer to the N-type semiconductor region located directly below the electrically insulating layer, wherein the N-type semiconductor region is an N-well and the P-type semiconductor region is a P-well, and wherein the N-well and the P-well are formed in the bulk semiconductor substrate selected from a group of substrates consisting essentially of an undoped substrate, a P-type substrate, and an N-type substrate.

5. An SOI CMOS device comprising:

a first gate;

a first body region which is located below the first gate and having a channel region, wherein the first body region is doped to be of a first polarity;

a first source region which is located adjacent to the first body region and which is doped to be of a second polarity which is opposite to the first polarity;

a first drain region which is located adjacent to the first body region and which is doped to be of the second polarity, wherein the first gate, the first body region, the first drain region, and the first source region form a first transistor;

a first field oxide region adjacent to the first transistor;

an electrically insulating layer below the first drain region, the first source region, the first field oxide region, and the first body region;

a first body extension doped to be of the first polarity extending below the first field oxide region and above the electrically insulating layer; and a first semiconductor region of a bulk semiconductor substrate located directly below the electrically insulating layer, the first drain region, the first body extension, the first field oxide region, the first source region, and the first body region, and substantially in alignment with the first body extension, the first semiconductor region being doped to be of the first polarity.

6. The SOI CMOS device according to claim 5 further comprising:

a second gate;

a second body region which is located below the second gate and having a second channel region, wherein the second body region is doped to be of the second polarity;

a second source region which is located adjacent to the second body region and which is doped to be of the first polarity;

a second drain region which is located adjacent to the second body region and which is doped to be of the first polarity, wherein the second gate, the second body region, the second drain region, and the second source region form a second transistor;

a second field oxide region adjacent to the second transistor, wherein the electrically insulating layer is below the second drain region, the second source region, the second field oxide region, and the second body region;

a second body extension doped to be of the second polarity extending below the second field oxide region and above the electrically insulating layer; and a second semiconductor region of a bulk semiconductor substrate located directly below the electrically insulating layer, the second drain region, the second body extension, the second field oxide region, the second source region, and the second body region, and substantially in alignment with the second body extension, the second semiconductor region being doped to be of the second polarity.

7. The SOI CMOS device, as recited in claim 6, wherein the first body extension completely separates the first field oxide region from the electrically insulating layer, wherein the first semiconductor region is an N-well and the second semiconductor region is a P-well, and wherein the N-well and the P-well are formed in the bulk semiconductor substrate selected from a group of substrates consisting essentially of an undoped substrate, a P-type substrate, and an N-type substrate.

8. The SOI CMOS device, as recited in claim 7, further comprising a contact plug extending through the first field oxide region, the first body extension, and the electrically insulating layer to the first semiconductor region.

9. The SOI CMOS device, as recited in claim 6, further comprising a contact plug extending through the first field oxide region, the first body extension, and the electrically insulating layer to the first semiconductor region, wherein the first semiconductor region is an N-well and the second semiconductor region is a P-well, and wherein the N-well and the P-well are formed in the bulk semiconductor substrate selected from a group of substrates consisting essentially of an undoped substrate, a P-type substrate, and an N-type substrate.

* * * * *